(12) United States Patent
Miyano

(10) Patent No.: US 12,385,969 B2
(45) Date of Patent: Aug. 12, 2025

(54) SEMICONDUCTOR DEVICE AND SEMICONDUCTOR DEVICE TESTING METHOD

(71) Applicant: LAPIS Technology Co., Ltd., Yokohama (JP)

(72) Inventor: Tomomi Miyano, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 170 days.

(21) Appl. No.: 18/461,463

(22) Filed: Sep. 5, 2023

(65) Prior Publication Data

US 2024/0085473 A1 Mar. 14, 2024

(30) Foreign Application Priority Data

Sep. 8, 2022 (JP) ................................ 2022-143300

(51) Int. Cl.
*G01R 31/28* (2006.01)

(52) U.S. Cl.
CPC ..... *G01R 31/2884* (2013.01); *G01R 31/2853* (2013.01); *G01R 31/2896* (2013.01)

(58) Field of Classification Search
CPC ............ G01R 31/2884; G01R 31/2853; G01R 31/2896; G01R 31/317; G01R 31/2601; G11C 29/12; G11C 29/54
USPC .................. 324/762.06, 762.01, 537, 500
See application file for complete search history.

(56) References Cited

U.S. PATENT DOCUMENTS

| 2016/0131704 | A1* | 5/2016 | Kawoosa | ............... | G11C 29/32 |
| | | | | | 714/729 |
| 2021/0231732 | A1* | 7/2021 | Park | ................... | G01R 31/3177 |
| 2022/0341991 | A1* | 10/2022 | Lai | .......................... | G11C 29/56 |

FOREIGN PATENT DOCUMENTS

JP 2007303897 11/2007

* cited by examiner

*Primary Examiner* — Giovanni Astacio-Oquendo
(74) *Attorney, Agent, or Firm* — JCIPRNET

(57) ABSTRACT

A semiconductor device includes: a first semiconductor chip including a first internal circuit, first flip-flop circuits connected to the first internal circuit, first selectors, and first electrodes connected to an output of the first selector; first connection conductors; and a second semiconductor chip including second electrodes connected to the first electrode via the first connection conductor and a second internal circuit connected to at least one second electrode. At least one of the first and second semiconductor chips includes a test circuit. The test circuit includes a first detection circuit receiving a signal from each second electrode, a first selector control circuit controlling the selection of the first selector, and an expected value generation circuit. Each first selector includes a signal input receiving a signal from at least one first flip-flop circuit and an expected value input receiving an expected value signal from the expected value generation circuit.

14 Claims, 6 Drawing Sheets

SEMICONDUCTOR DEVICE AND SEMICONDUCTOR DEVICE TESTING METHOD

CROSS-REFERENCE TO RELATED APPLICATION

This application claims priority under 35 USC 119 from Japanese Patent application No. 2022-143300 filed on Sep. 8, 2022, the disclosure of which is incorporated by reference herein.

BACKGROUND

Technical Field

The disclosure relates to a semiconductor device and a semiconductor device testing method.

Description of Related Art

Japanese Patent Application Laid-Open No. 2007-303897 discloses a scan test method for multi-chip packages. In this method, data sent out from a first scan chain circuit is passed to a second scan chain circuit. The data received by the second scan chain circuit is compared with expected values. Based on the comparison of expected values, the success or failure of data transmission/reception is determined.

When mounting a plurality of semiconductor chips (Large Scale Integrated Circuit: LSI) in three dimensions (3D) or a multi-chip package (MCP), it is also necessary to test whether or not connections are proper between mounted semiconductor chips in addition to the test of the individual semiconductor chip.

The 3D mounting is performed in various ways by connections via wires or bumps and the use of through wires. Any form requires the test of the interconnection between the semiconductor chips.

In testability (DFT), the interconnections between two semiconductor chips are placed in a series of shift registers to form a scan chain. A pattern is inputted from the input to the scan chain formed in this way and an output pattern is obtained from the output.

However, since the path of the test pattern includes scan chains, information on a failure interconnection at a location between semiconductor chips reaches the output after passing through elements or circuits on the downstream side of that interconnection. The test time increases when passing through the elements or circuits on the downstream side.

The disclosure provides a semiconductor device and a semiconductor device testing method capable of shortening the time for testing whether the connection between semiconductor chips is good or bad.

SUMMARY

An aspect of the disclosure provides a semiconductor device. The semiconductor device includes: a first semiconductor chip which includes a first internal circuit, multiple first flip-flop circuits connected to the first internal circuit, multiple first selectors, and multiple first electrodes connected to respective outputs of the first selectors; multiple first connection conductors; and a second semiconductor chip which includes multiple second electrodes respectively connected to the first electrodes via the first connection conductors and a second internal circuit connected to at least one of the second electrodes. At least one of the first semiconductor chip and the second semiconductor chip includes a part of a test circuit unit. The test circuit unit includes a first detection circuit which receives a signal from each of the second electrodes, a first selector control circuit which controls the first selectors, a first expected value generation circuit which generates a first expected value signal including a first expected value, and a test circuit which receives an output of the first detection circuit. Each of the first selectors includes a first signal input which receives a signal from any one of the first flip-flop circuits and a first expected value input which receives the first expected value signal from the first expected value generation circuit.

Another aspect of the disclosure provides a semiconductor device. The semiconductor device includes: a first semiconductor chip which includes a first internal circuit, multiple first flip-flop circuits connected to the first internal circuit, multiple first selectors, and multiple first electrodes connected to respective outputs of the first selectors; multiple first connection conductors; multiple second connection conductors; and a second semiconductor chip which includes a second internal circuit, multiple second flip-flop circuits connected to the second internal circuit, multiple second selectors, multiple second electrodes respectively connected to the first electrodes via the first connection conductors, and multiple third electrodes connected to respective outputs of the second selectors. The first semiconductor chip further includes multiple fourth electrodes which are respectively connected to the third electrodes via the second connection conductors. At least one of the first semiconductor chip and the second semiconductor chip includes a part of a test circuit unit. The test circuit unit includes a first detection circuit which receives a signal from each of the second electrodes, a first selector control circuit which controls the first selectors, a first expected value generation circuit which generates a first expected value signal including a first expected value, a second detection circuit which receives a signal from each of the fourth electrodes, a second selector control circuit which controls the second selectors, a second expected value generation circuit which generates a second expected value signal including a second expected value, and a test circuit which receives outputs of the first detection circuit and the second detection circuit. Each of the first selectors includes a first signal input which receives a signal from any one of the first flip-flop circuits and a first expected value input which receives the first expected value signal from the first expected value generation circuit. Each of the second selectors includes a second signal input which receives a signal from any one of the second flip-flop circuits and a second expected value input which receives the second expected value signal from the second expected value generation circuit.

Yet another aspect of the disclosure provides a semiconductor device testing method for a semiconductor device. The semiconductor device includes: a first semiconductor chip which includes a first internal circuit, first flip-flop circuits connected to the first internal circuit, first selectors, and first electrodes connected to respective outputs of the first selectors; first connection conductors; and a second semiconductor chip which includes second electrodes respectively connected to the first electrodes via the first connection conductors and a second internal circuit connected to at least one of the second electrodes. At least one of the first semiconductor chip and the second semiconductor chip includes a part of a test circuit unit. The test circuit unit includes a first detection circuit which receives a signal from each of the second electrodes, a first selector control circuit which controls the first selectors, a first expected value generation circuit which generates a first expected value signal including a first expected value, and a test circuit which receives an output of the first detection circuit. The first expected value generation circuit generates and supplies the first expected value signal of the same first expected value to all of the first selectors, the first selector control circuit controls the first selectors to output the first expected value signal input to a first expected value input of each of the first selectors, the first detection circuit generates a value indicating a first detection result based on a signal input from each of the second electrodes, and the test circuit tests whether or not the first expected value matches a value indicating the first detection result.

DESCRIPTION OF THE EMBODIMENTS

According to the disclosure, the semiconductor device and the semiconductor device testing method are capable of shortening the time for testing whether the connection between semiconductor chips is good or bad.

Hereinafter, each embodiment for carrying out the disclosure will be described with reference to the drawings.

Figure 1:
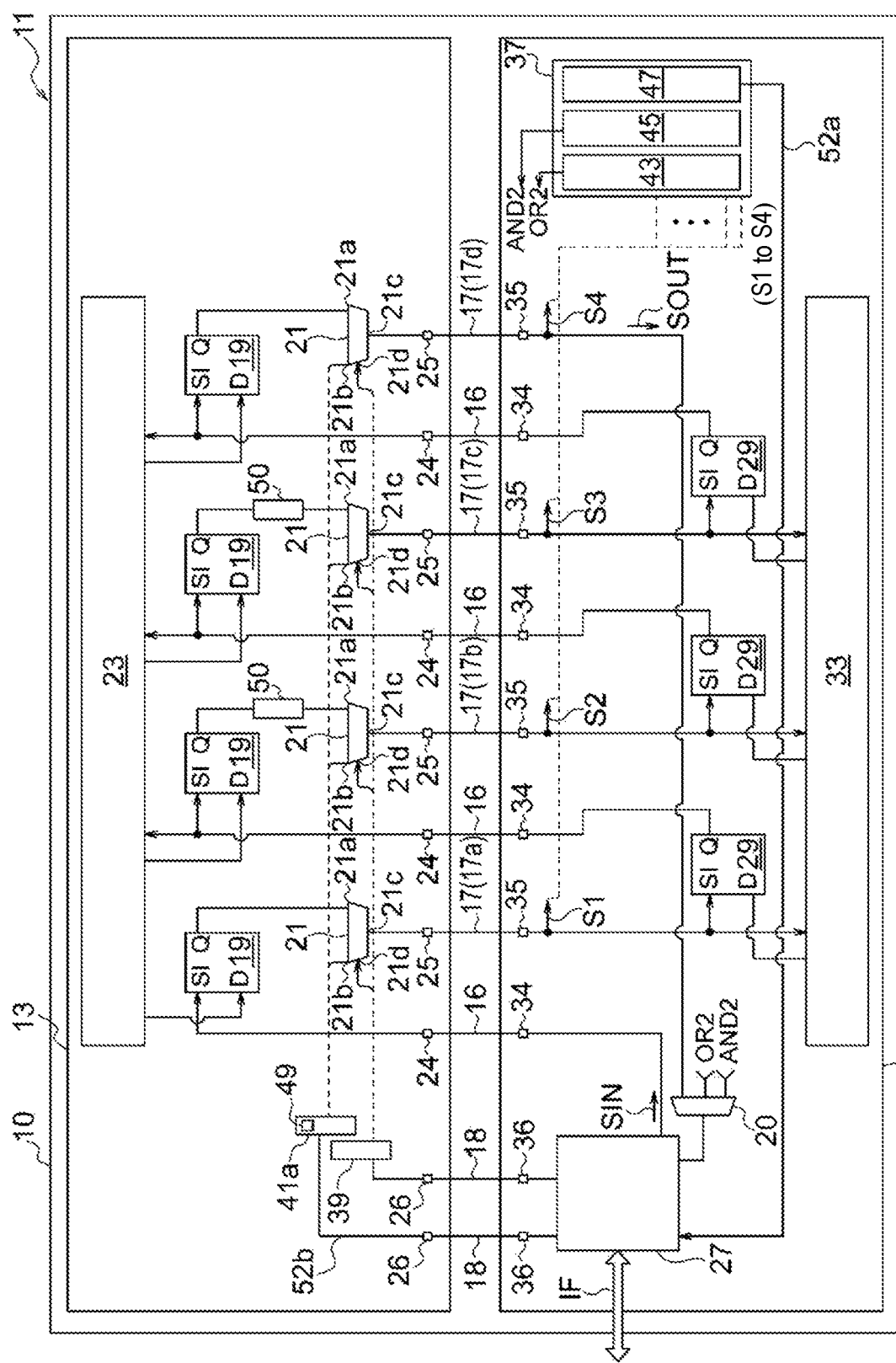
FIG. 1 is a diagram showing a semiconductor device according to an embodiment of the disclosure.

FIG. 1 is a diagram showing a semiconductor device according to an embodiment of the disclosure.

A semiconductor device 11 includes a plurality of semiconductor chips and a plurality of first connection conductors 17. In this embodiment, the semiconductor device includes a first semiconductor chip 13 and a second semiconductor chip 15 as the plurality of semiconductor chips and includes first connection conductors 17a to 17d as the plurality of first connection conductors 17. The semiconductor device 11 can be, for example, a three-dimensional (3D) IC or a multi-chip package (MCP). Further, the semiconductor device may further include a support component 10 such as a package for mounting a plurality of semiconductor chips in three dimensions (3D) or in a multi-chip package. The support component 10 can support the first semiconductor chip 13, the second semiconductor chip 15, and the plurality of first connection conductors 17 which are assembled. As will be understood from the subsequent description, the plurality of first connection conductors 17 can include wires, bumps, through wires, and the like for connecting the first semiconductor chip 13 and the second semiconductor chip 15 to each other.

The first semiconductor chip 13 includes a plurality of first flip-flop circuits 19, a plurality of first selectors 21, a first internal circuit 23, and a plurality of first electrodes 25.

The first internal circuit 23 can include a circuit such as a logic circuit configured to provide the main function of the first semiconductor chip 13. The plurality of first flip-flop circuits 19 is connected to the first internal circuit 23. In this embodiment, the first flip-flop circuit 19 can be, for example, a D-type flip-flop circuit and the D-type flip-flop circuit includes an input SI, an input D, and an output Q and can include an output Q_ (Q bar) (not shown) if necessary. The input (for example, the input D) of the plurality of first flip-flop circuits 19 is connected to the first internal circuit 23 and the output (for example, the output Q) of the plurality of first flip-flop circuits 19 is connected to each of the first selector circuits 21. The plurality of first electrodes 25 can include, for example, conductors for external connection such as pad electrodes and bump electrodes. The plurality of first electrodes 25 is connected to each of the first selectors 21.

The second semiconductor chip 15 includes a plurality of second flip-flop circuits 29, a second internal circuit 33, and a plurality of second electrodes 35. The second internal circuit 33 can be connected to at least one of the plurality of second electrodes 35. The plurality of second electrodes 35 can include, for example, conductors for external connection such as pad electrodes and bump electrodes.

The first semiconductor chip 13 and the second semiconductor chip 15 are connected to each other via the plurality of first connection conductors 17. Specifically, the plurality of second electrodes 35 of the second semiconductor chip 15 is respectively connected to the plurality of first electrodes 25 of the first semiconductor chip 13 via the plurality of first connection conductors 17.

At least one of the first semiconductor chip 13 and the second semiconductor chip 15 includes a test circuit 27. FIG. 1 shows a case in which the test circuit 27 is provided in the second semiconductor chip 15.

The semiconductor device 11 can include a first detection circuit 37, a first selector control circuit 39, and a first expected value generation circuit 41a. The test circuit 27, the first detection circuit 37, the first selector control circuit 39, and the first expected value generation circuit 41a are examples of the test circuit unit. The first detection circuit 37 receives signals (S1 to S4) from the plurality of second electrodes 35. The first selector control circuit 39 controls the plurality of first selectors 21. The first expected value generation circuit 41a generates expected value signals of expected values [0] or [1] to be provided to the plurality of first selectors 21.

The test circuit unit may be provided in any one of the first semiconductor chip 13 and the second semiconductor chip 15 or may be provided in a part of both of the first semiconductor chip 13 and the second semiconductor chip 15. That is, at least one of the first semiconductor chip 13 and the second semiconductor chip 15 includes a part of the test circuit unit. FIG. 1 shows a case in which the first selector control circuit 39 and the first expected value generation circuit 41a are provided in the first semiconductor chip 13 as a part of the test circuit unit and the test circuit 27 and the first detection circuit 37 are provided in the second semiconductor chip 15 as a part of the test circuit unit.

Each of the plurality of first selectors 21 includes a first signal input 21a, a first expected value input 21b, a first selector output 21c, and a first selection input 21d. The first signal input 21a is connected to any one output (for example, the output Q) of the plurality of first flip-flop circuits 19 and receives a signal from the output. The first expected value input 21b receives an expected value signal of an expected value [0] or [1] from the first expected value generation circuit 41a. The first selector output 21c is connected to the first electrode 25. Each of the plurality of first selectors 21 connects the first expected value input 21b to the first selector output 21c in a test mode according to the embodiment that uses the test circuit 27. The first selector 21 connects the first signal input 21a to the first selector output 21c in an operation mode different from the test mode.

According to the semiconductor device 11, the first selector control circuit 39 controls the plurality of first selectors 21 in the test mode so that the plurality of first selectors 21 pass the expected value signal from the first expected value generation circuit 41a. The expected value signal passed through the first selector 21 is provided to the first electrode 25. The first detection circuit 37 receives each of the signals (S1 to S4) from the second electrode 35. When the expected value signal from the first expected value generation circuit 41a to the first expected value input 21b can be given to the first detection circuit 37 via the plurality of first electrodes 25 of the first semiconductor chip 13 and the plurality of second electrodes 35 of the second semiconductor chip 15, it is possible to test whether or not the first semiconductor chip 13 and the second semiconductor chip 15 are properly connected via the plurality of first connection conductors 17.

In the semiconductor device 11, for example, each of the plurality of second electrodes 35 is configured to receive an expected value signal of an expected value [0] and [1] from the first selector 21 via the first electrode 25 and the first connection conductor 17. In the semiconductor device 11 including interconnections by four first connection conductors 17 between four first electrodes 25 and four second electrodes 35, the first detection circuit 37 receives four signals (S1 to S4) from four second electrodes 35. The first detection circuit 37 can detect the value of the signal input based on four signals (S1 to S4) from four second electrodes 35 and provide a value indicating the detection result.

The first detection circuit 37 can include, for example, at least one of a first OR circuit 43 and a first AND circuit 45.

The first OR circuit 43 receives four signals (S1 to S4) from four second electrodes 35 and generates an OR result of four signals (S1 to S4) from four second electrodes 35. The first OR circuit 43 generates a value [0] indicating the detection result in response to the expected value signals of all expected values [0] from the plurality of first selectors 21 and generates and outputs a value [1] indicating the detection result in response to the expected value signal of at least one expected value [1] from the plurality of first selectors 21. That is, a value "1" indicating the detection result is output as the output value of the first OR circuit 43. A value [0] or [1] indicating these detection results is provided to the test circuit 27 and the test circuit 27 tests whether or not the output value of the first OR circuit 43 matches the expected value for the input expected value signal.

The first AND circuit 45 receives four signals (S1 to S4) from four second electrodes 35 and generates an AND result of four signals (S1 to S4) from four second electrodes 35. The first AND circuit 45 generates a value [1] indicating the detection result in response to the expected value signals of all expected values [1] from the plurality of first selectors 21 and generates and outputs a value [0] indicating the detection result in response to the expected value signal of at least one expected value [0] from the plurality of first selectors 21. That is, a value [0] indicating the detection result is output as the output value of the first AND circuit 45. A value [0] or [1] indicating these detection results is provided to the test circuit 27 and the test circuit 27 tests whether or not the output value of the first AND circuit 45 matches the expected value for the input expected value signal.

Figure 2B:
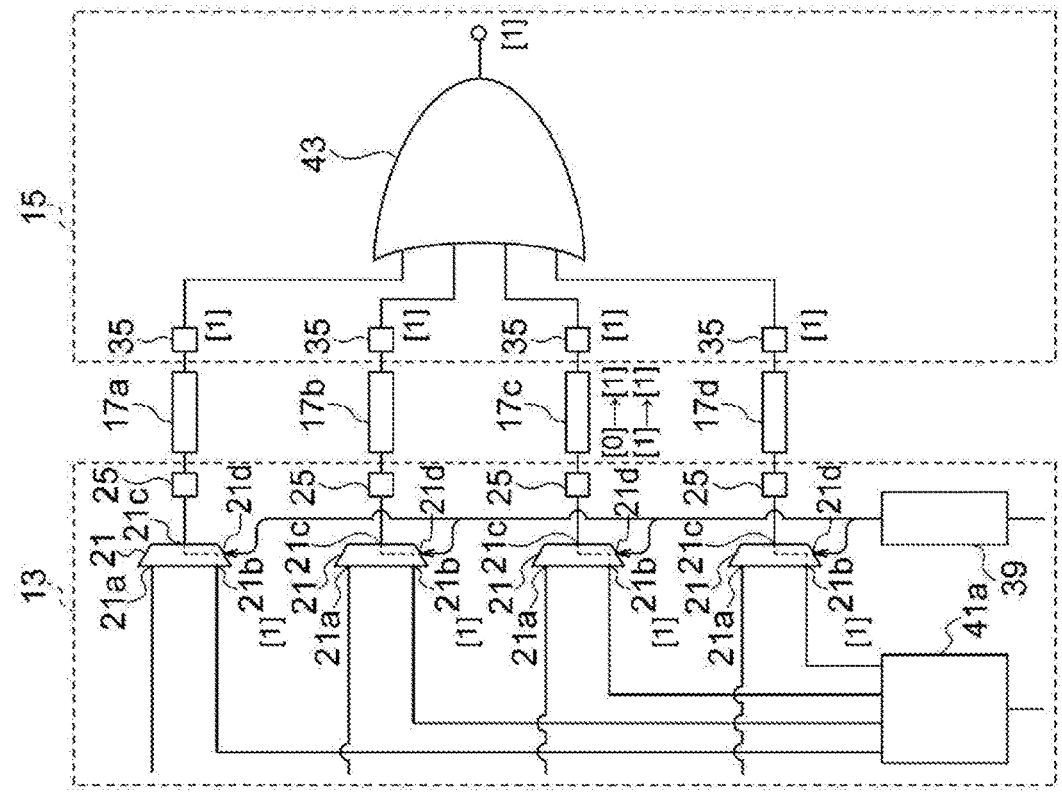
FIG. 2A and FIG. 2B are diagrams showing specific examples of a logic circuit of the semiconductor device according to the embodiment of the disclosure.
Figure 2A:
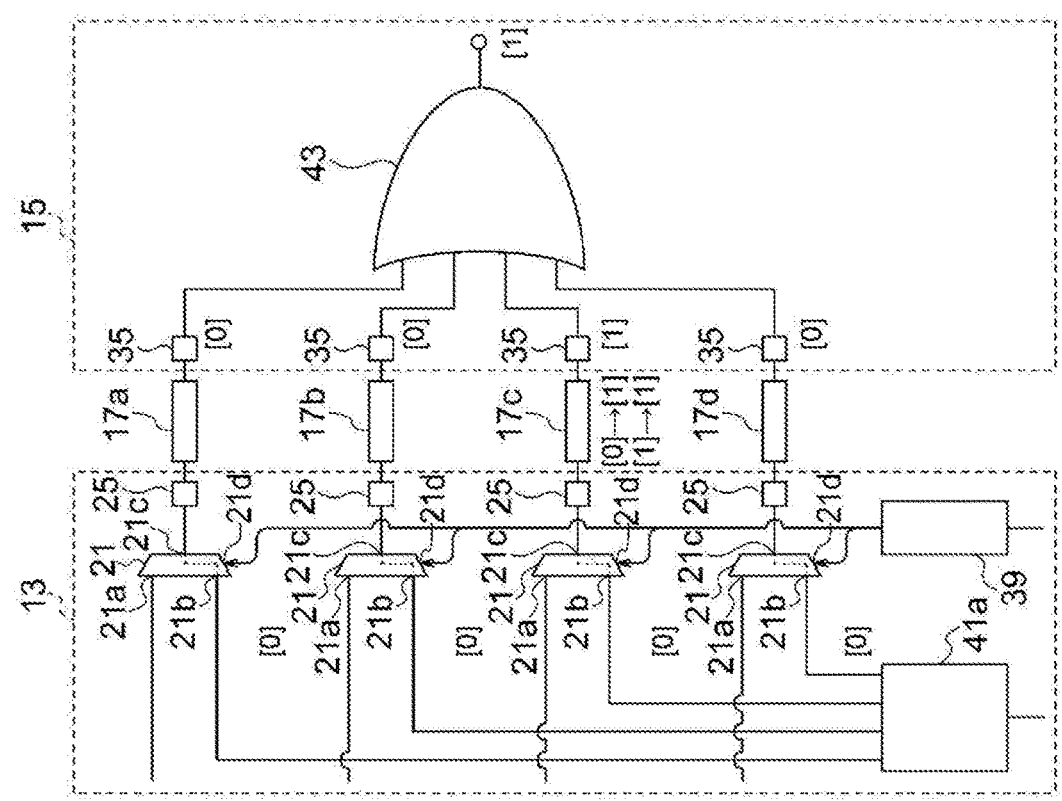
Figures 3A, 3B:
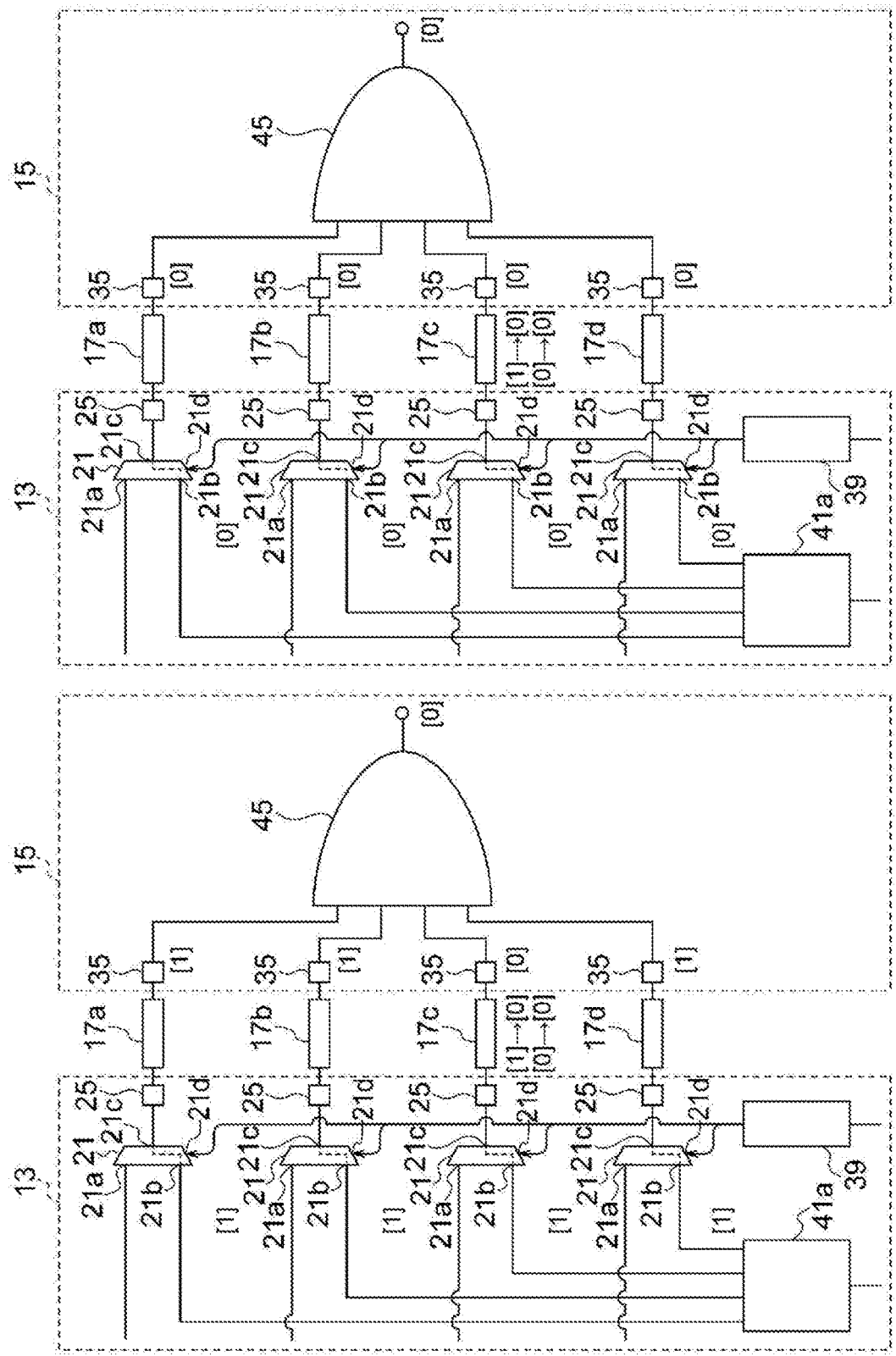
FIG. 3A and FIG. 3B are diagrams showing specific examples of the logic circuit of the semiconductor device according to the embodiment of the disclosure.

FIG. 2A and FIG. 2B are diagrams showing the first OR circuit 43 and the plurality of first connection conductors 17 (17a, 17b, 17c, 17d) between the first semiconductor chip 13 and the second semiconductor chip 15 in the semiconductor device 11 according to this embodiment. FIG. 3A and FIG. 3B are diagrams showing the first AND circuit 45 and the plurality of first connection conductors 17 (17a, 17b, 17c, 17d) between the first semiconductor chip 13 and the second semiconductor chip 15 in the semiconductor device 11 according to this embodiment. Referring to FIG. 2A and FIG. 2B and FIG. 3A and FIG. 3B, the operation of the first OR circuit 43 and the first AND circuit 45 will be described. The first selector control circuit 39 controls the plurality of first selectors 21 so that all of the plurality of first selectors 21 passes the expected value signal from the first expected value generation circuit 41a.

Referring to FIG. 2A and FIG. 2B, four first electrodes 25 and four second electrodes 35 are connected to each other by four first connection conductors 17a, 17b, 17c, and 17d and the signals from four second electrodes 35 are given to the first OR circuit 43.

Regarding the expected value signals of the expected values [0] or [1] from four first selectors 21 to four first electrodes 25, when a signal value [1] is always transmitted to the second electrode 35 in at least one of four first connection conductors 17a, 17b, 17c, and 17d, for example, the first connection conductor 17c, the first OR circuit 43 responses as below.

As shown in FIG. 2A, the first OR circuit 43 generates a value [1] indicating the detection result in response to the expected value signals of all expected values [0] from four first selectors 21. Then, a value indicating this detection result is output as the output value of the first OR circuit 43. A value [1] indicating this detection result is provided to the test circuit 27 and the test circuit 27 generates a test result indicating that the output value of the first OR circuit 43 does not match the expected value [0] for all input expected value signals.

Further, as shown in FIG. 2B, the first OR circuit 43 generates a value [1] indicating the detection result in response to the expected value signals of all expected values [1] from four first selectors 21. Then, a value indicating this detection result is output as the output value of the first OR circuit 43. When a value [1] indicating this detection result is provided to the test circuit 27, the test circuit 27 generates a test result indicating that the output value of the first OR circuit 43 matches the input expected value [1] for all input expected value signals.

Referring to FIG. 3A and FIG. 3B, four first electrodes 25 and four second electrodes 35 are connected to each other by four first connection conductors 17a, 17b, 17c, and 17d and the signals from four second electrodes 35 are given to the first AND circuit 45.

Regarding the expected value signals of the expected values [0] or [1] from four first selectors 21 to four first electrodes 25, when a signal value [0] is always transmitted to the second electrode 35 in at least one of four first connection conductors 17a, 17b, 17c, and 17d, for example, the first connection conductor 17c, the first AND circuit 45 responses as below.

As shown in FIG. 3A, the first AND circuit 45 generates a value [0] indicating the detection result in response to the expected value signals of all expected values [1] from four first selectors 21. A value [0] indicating this detection result is provided to the test circuit 27 and the test circuit 27 generates a test result indicating that the output value of the first AND circuit 45 does not match the expected value [1] for all input expected value signals.

Further, as shown in FIG. 3B, the first AND circuit 45 generates a value [0] indicating the detection result in response to the expected value signals of all expected values [0] from four first selectors 21. Then, a value indicating this detection result is output as the output value of the first AND circuit 45. A value [0] indicating this detection result is provided to the test circuit 27 and the test circuit 27 generates a test result indicating that the output value of the first AND circuit 45 matches the expected value [0] for all input expected value signals.

It has been described that an interconnection always transmitting a signal value [0] to the second electrode 35 and an interconnection always transmitting a signal value [1] thereto can be detected while describing the operation of the 4-input OR circuit and the 4-input AND circuit. The semiconductor device 11 can use an N-input OR circuit and an N-input AND circuit instead of the 4-input OR circuit 43 and the 4-input AND circuit 45.

When an expected value signal of an expected value [0] is given to all of the first expected value inputs 21b of N number of the first selectors 21 and the expected value signal of this expected value is transmitted from the first electrode 25 to the second electrode 35, the first OR circuit 43 generates a signal with a logic value of "0". However, when the expected value signal of this expected value is not transmitted from the first electrode 25 to the second electrode 35, specifically, at least one of N number of interconnections transmits a signal value [1] from the first electrode to the second electrode 35, a signal with a logic value of "1" is generated. The first OR circuit 43 can be used to detect that at least one of N number of interconnections always gives a signal value [1] to the second electrode 35.

When an expected value signal of an expected value [1] is given to all of the first expected value inputs 21b of N number of the first selectors 21 and the expected value signal of this expected value is transmitted from the first electrode 25 to the second electrode 35, the first AND circuit 45 generates a signal with a logic value of "1". However, when the expected value signal of this expected value is not transmitted from the first electrode 25 to the second electrode 35, specifically, at least one of N number of interconnections transmits a signal value [0] from the first electrode to the second electrode 35, a signal with a logic value of "0" is generated. The first AND circuit 45 can be used to detect that at least one of N number of interconnections always gives a signal value [0] to the second electrode 35.

It has been described that an interconnection always transmitting a signal value [0] to the second electrode 35 and an interconnection always transmitting a signal value [1] thereto are detected by using the plurality of first selectors 21 and the first detection circuit 37.

Next, a case of detecting a connection position of an interconnection always transmitting a signal value [0] and an interconnection always transmitting a signal value [1] will be described.

As shown in FIG. 1, the first detection circuit 37 can include a first logic circuit 47 in addition to the first OR circuit 43 and the first AND circuit 45. The first logic circuit 47 receives four signals (S1 to S4) from four second electrodes 35 and generates a set of values based on four signals (S1 to S4) from four second electrodes 35. The first logic circuit 47 generates and outputs a value indicating the detection result in response to the expected value signals of the expected values [0] or [1] from the plurality of first selectors 21. That is, a value indicating the detection result is output as the output value of the first logic circuit 47. A value indicating the detection result is provided to the test circuit 27 and the test circuit 27 tests whether or not a set of output values of the first logic circuit 47 match a set of expected values for the input expected value signals. The first expected value generation circuit 41a provides expected value signals of independent expected values [0] or [1] to the first expected value inputs 21b of the plurality of first selectors 21.

Again, a description will be made by exemplifying a case in which the expected value signals of the expected values [0] or [1] from four first selectors 21 to four first electrodes 25 are always transmitted to the second electrode 35 as a signal value [0] in at least one of four first connection conductors 17a, 17b, 17c, and 17d, for example, the first connection conductor 17c.

Figure 4B:
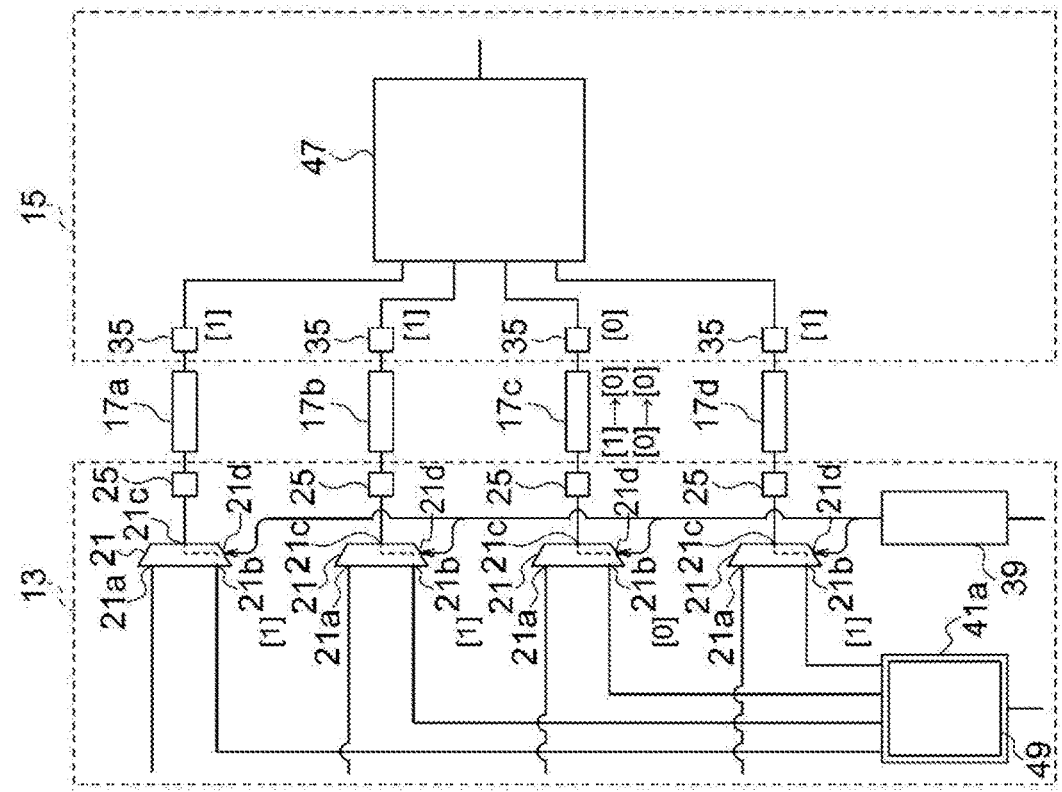
FIG. 4A and FIG. 4B are diagrams showing specific examples of the logic circuit of the semiconductor device according to the embodiment of the disclosure.
Figure 4A:
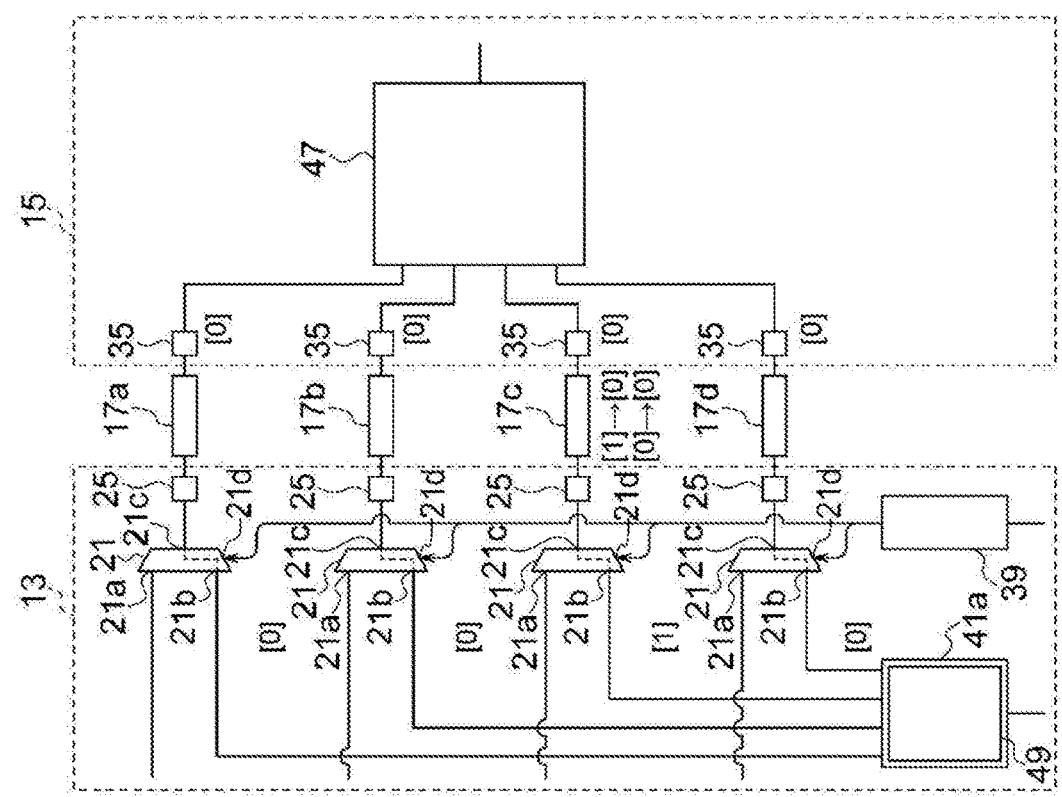

FIG. 4A and FIG. 4B are diagrams showing the first logic circuit 47 and the plurality of first connection conductors 17 (17a, 17b, 17c, 17d) of the first semiconductor chip 13 and the second semiconductor chip 15 in the semiconductor device 11 according to this embodiment. Referring to FIG. 4A and FIG. 4B, the operation of the first logic circuit 47 will be described. The first selector control circuit 39 controls the plurality of first selectors 21 so that all of the plurality of first selectors 21 pass the expected value signal from the first expected value generation circuit 41a.

Referring to FIG. 4A and FIG. 4B, four first electrodes 25 and four second electrodes 35 are connected to each other by four first connection conductors 17a, 17b, 17c, and 17d and signals are given from four second electrodes 35 to the first logic circuit 47. The first expected value generation circuit 41a provides expected value signals of independent expected values to the first expected value inputs 21b of four first selectors 21. When the expected value signal of such an expected value is given, the test circuit 27 tests the response of the first logic circuit 47 to the signal from the second electrode 35.

As shown in FIG. 4A, among many processes of providing the expected value signals of various independent expected values from the first expected value generation circuit 41a, for example, the expected value signal of the expected value below is given to each of the first expected value inputs 21b of four first selectors 21.

Expected value of first expected value input 21b of first selector 21 related to first connection conductor 17a: [0]

Expected value of first expected value input 21b of first selector 21 related to first connection conductor 17b: [0]

Expected value of first expected value input 21b of first selector 21 related to first connection conductor 17c: [1]

Expected value of first expected value input 21b of first selector 21 related to first connection conductor 17d: [0]

For the expected value signal of such an expected value, the values of the signals (S1 to S4 according to the reference numerals shown in FIG. 1) on the second electrode 35 input to the first logic circuit 47 are as below.

Value of signal on second electrode 35 related to first connection conductor 17a: [0]

Value of signal on second electrode 35 related to first connection conductor 17b: [0]

Value of signal on second electrode 35 related to first connection conductor 17c: [0]

Value of signal on second electrode 35 related to first connection conductor 17*d*: [0]

The set of the expected values of the expected value signals input to the first expected value inputs 21*b* of four first selectors 21 is [0], [0], [1], and [0] in order in the first connection conductors 17*a* to 17*d* and the set of the values of the signals on four second electrodes 35 is [0], [0], [0], and [0] in order in the first connection conductors 17*a* to 17*d*. While the expected value on the first electrode 25 related to the first connection conductor 17*c* is [1], the value of the signal on the second electrode 35 related to the first connection conductor 17*c* is [0]. The first logic circuit 47 generates a value indicating the detection result based on each of the signals from four second electrodes. Then, a value indicating this detection result is output as the output value of the first logic circuit 47. A value indicating this detection result is provided to the test circuit 27 and the test circuit 27 generates a test result indicating that the set of the output values of the first logic circuit 47 does not match the set of the input expected values.

Further, as shown in FIG. 4B, among many processes of providing the expected value signals of various independent expected values from the first expected value generation circuit 41*a*, for example, the expected value signal of the expected value below is given to each of the first expected value inputs 21*b* of four first selectors 21.

Expected value of first expected value input 21*b* of first selector 21 related to first connection conductor 17*a*: [1]
Expected value of first expected value input 21*b* of first selector 21 related to first connection conductor 17*b*: [1]
Expected value of first expected value input 21*b* of first selector 21 related to first connection conductor 17*c*: [0]
Expected value of first expected value input 21*b* of first selector 21 related to first connection conductor 17*d*: [1]

For the expected value signal of such an expected value, the values of the signals (S1 to S4 according to the reference numerals shown in FIG. 1) on the second electrode 35 input to the first logic circuit 47 are as below.

Value of signal on second electrode 35 related to first connection conductor 17*a*: [1]
Value of signal on second electrode 35 related to first connection conductor 17*b*: [1]
Value of signal on second electrode 35 related to first connection conductor 17*c*: [0]
Value of signal on second electrode 35 related to first connection conductor 17*d*: [1]

The set of the expected values of the expected value signals input to the first expected value inputs 21*b* of four first selectors 21 is [1], [1], [0], and [1] in order in the first connection conductors 17*a* to 17*d* and the set of the values of the signals on four second electrodes 35 is [1], [1], [0], and [1] in order in the first connection conductors 17*a* to 17*d*. While the expected value on the first electrode 25 related to the first connection conductor 17*c* is [0], the value of the signal on the second electrode 35 related to the first connection conductor 17*c* is also [0]. The first logic circuit 47 generates a value indicating the detection result based on each of the signals from four second electrodes. Then, a value indicating this detection result is output as the output value of the first logic circuit 47. A value indicating this detection result is provided to the test circuit 27 and the test circuit 27 generates a test result indicating that the set of the output values of the first logic circuit 47 matches the set of the input expected values.

Further, when the expected value signals of the expected values [0] or [1] from four first selectors 21 to four first electrodes 25 are always transmitted to the second electrode 35 as a signal value [1] in at least one of four first connection conductors 17*a*, 17*b*, 17*c*, and 17*d*, for example, the first connection conductor 17*c*, the description can be said in an opposite manner. That is, the value of the signal on the first electrode 25 related to the first connection conductor 17*c* is [1] while the expected value on the first electrode 25 related to the first connection conductor 17*c* is an expected value [1] and the test circuit 27 generates a test result indicating that the set of the output values of the first logic circuit 47 matches the set of the input expected values. Further, the value of the signal on the first electrode 25 related to the first connection conductor 17*c* is an expected value [1] while the expected value on the first electrode 25 related to the first connection conductor 17*c* is [0] and the test circuit 27 generates a test result indicting that the set of the output values of the first logic circuit 47 does not match the set of the input expected values.

The first expected value generation circuit 41*a* supplies a first value [0] or [1] to one of four first selectors 21 as the expected value and supplies a second value [1] or [0] different from the first value [0] or [1] to the other three first selectors 21 as the expected values. The first logic circuit 47 receives signals from four second electrodes 35 and generates a value indicating the detection result in response to the supplied signals. A value indicating this detection result is provided to the test circuit 27 and the test circuit 27 tests whether or not the set of the values indicating the detection result corresponding to each of four first selectors 21 matches the set of the input expected values. It is possible to identify the connection conductor which does not match the expected value by sequentially applying a combination of various sets of the expected values to the first expected value input 21*b* of the first selector 21.

It has been described that the connection positions of an interconnection always transmitting a signal value [0] to the second electrode 35 and an interconnection always transmitting a signal value [1] thereto can be detected while describing the operation of the 4-input OR circuit. The semiconductor device 11 can use an N-input logic circuit instead of the 4-input logic circuit.

When an expected value signal of an expected value [1] is given to one of the first expected value inputs 21*b* of N number of the first selectors 21, an expected value signal of an expected value [0] is given to the other three first selectors 21, and the expected value signal of this expected value is transmitted from the first electrode 25 to the second electrode 35, the first logic circuit 47 generates a set of signals of values corresponding to a set of the expected values input based on the signals respectively given to N number of the first selectors 21. However, when the expected value signal of this expected value is not transmitted from the first electrode 25 to the second electrode 35, specifically, an interconnection corresponding to the first selector 21 receiving an expected value signal of an expected value [1] transmits a signal value [0] from the first electrode 25 to the second electrode 35, a set of signals of values not corresponding to the set of input expected values is generated based on the signals respectively given to N number of the first selectors 21. The first logic circuit 47 can be used to detect that an interconnection corresponding to the first selector receiving an expected value signal of an expected value [1] always gives a signal value [0].

When an expected value signal of an expected value [0] is given to one of the first expected value inputs 21b of N number of the first selectors 21, an expected value signal of an expected value [1] is given to the other three first selectors 21, and the expected value signal of this expected value is transmitted from the first electrode 25 to the second electrode 35, the first logic circuit 47 generates a set of signals of values corresponding to a set of the expected values input based on the signals respectively given to N number of the first selectors 21. However, when the expected value signal of the expected value is not transmitted from the first electrode 25 to the second electrode 35, specifically, an interconnection corresponding to the first selector 21 receiving an expected value signal of an expected value [0] transmits a signal value [1] from the first electrode 25 to the second electrode 35, a set of signals of values not corresponding to the set of input expected values is generated based on the signals respectively given to N number of the first selectors 21. The first logic circuit 47 can be used to detect that an interconnection corresponding to the first selector receiving an expected value signal of an expected value [0] always gives a signal value [1].

A first encoder circuit 49 that generates a signal value corresponding to the number of the first selectors 21 connected to the first electrodes 25 related to all interconnections to be inspected may be provided to the first expected value generation circuit 41a in order to generate such a combination of expected values. Further, a decoder circuit that generates a value based on the signals from the plurality of second electrodes 35 by receiving the signals from the second electrodes 35 related to all interconnections to be inspected may be provided to the first logic circuit 47 in order to analyze the mismatch of the values of the generated signals. The signal from this decoder circuit is provided to the test circuit 27 in order to test the value of the signal from the second electrode 35.

Again, the semiconductor device 11 will be described with reference to FIG. 1. In the second semiconductor chip 15, the second internal circuit 33 may include a circuit, for example, a logic circuit configured to provide a main function of the second semiconductor chip 15. The second flip-flop circuit 29 is connected to the second internal circuit 33. In this embodiment, the second flip-flop circuit 29 can be, for example, a D-type flip-flop circuit and this D-type flip-flop circuit includes an input SI, an input D, and an output Q and can include an output Q_ (Q bar) output (not shown) if necessary. The signals (S1 to S4) of the plurality of second electrodes 35 are connected to the inputs (for example, the inputs SI) of the second flip-flop circuits 29 and are connected to the second internal circuit 33. The input (for example, the input D) of the second flip-flop circuit 29 is connected to the second internal circuit.

The outputs (for example, the outputs Q) of the plurality of second flip-flop circuits 29 are connected to the inputs (for example, the inputs SI) of the plurality of first flip-flop circuits 19 via the plurality of third electrodes 34 of the second semiconductor chip 15, the plurality of second connection conductors 16, and the plurality of fourth electrodes 24 of the first semiconductor chip 13 and are connected to the first internal circuit 23.

Further, the SIN line from the test circuit 27 is connected to any one input (for example, the input SI) of the plurality of first flip-flop circuits 19 via the third electrode 34 of the second semiconductor chip 15, the second connection conductor 16, and the fourth electrode 24 of the first semiconductor chip 13.

The test circuit 27 receives an output value OR2 of the first OR circuit 43, an output value AND2 of the first AND circuit 45, and a signal SOUT from at least one output (for example, the output Q) of the plurality of first flip-flop circuits 19 via the selector 20. The selector 20 selects a signal to be provided to the test circuit 27 and to be tested from the output value OR2 of the first OR circuit 43, the output value AND2 of the first AND circuit 45, and the signal SOUT from the first flip-flop circuit 19 according to the content of the test.

Further, the test circuit 27 receives the output of the first logic circuit 47, specifically, the signal from the decoder circuit via an expected value bus 52a (decoded signal).

The test circuit 27 can receive signals related to the test pattern, the test mode, and the expected value via the interface IF with the outside of the semiconductor device 11 or can output the signals.

The test circuit 27 can be connected to the selector control circuit 39 via a fifth electrode 36 of the second semiconductor chip 15, a third connection conductor 18, and a sixth electrode 26 of the first semiconductor chip 13.

The test circuit 27 is connected to the first expected value generation circuit 41a (for example, the encoder circuit) via an input value bus 52b that passes through the fifth electrode 36 of the second semiconductor chip 15, the third connection conductor 18, and the sixth electrode 26 of the first semiconductor chip 13. The first expected value generation circuit 41a (specifically, the encoder circuit) generates N number of the expected value signals including the expected values from the signals on the input value bus 52b.

The electrodes 24, 26, 34, and 36 can include conductors for external connection such as pad electrodes and bump electrodes similarly to the above-described electrodes (25, 35). In the semiconductor device 11, the test circuit 27 provides signals on the input line bus 52b to the first expected value generation circuit 41a and tests the results from the expected value bus 52a in order to generate independent expected values. Specifically, the signals (S1 to S4) input from the plurality of second electrodes 35 of the first semiconductor chip 13 are decoded and the decoded signals are given from the expected value bus 52a to the test circuit 27 and are evaluated in the test circuit 27.

Referring to FIG. 1, for example, a combinational logic circuit 50 is disposed on each of the signal lines related to the first connection conductors 17b and 17c. The combinational logic circuit 50 receives a signal from the output (for example, the output Q) of the first flip-flop circuit 19 and is connected to the first signal input 21a of the first selector 21.

The semiconductor device 11 interrupts signals from the first flip-flop circuit 19 and the combinational logic circuit 50 by using the first selector 21 connected to the first connection conductor 17. Hence, the mismatch of the expected values related to the first connection conductor 17 is not caused by the combinational logic circuit 50 and/or the first flip-flop circuit 19. For example, it is possible to determine whether or not there is a problem with the combinational logic circuit 50 from a test related to a scan chain.

Figure 5:
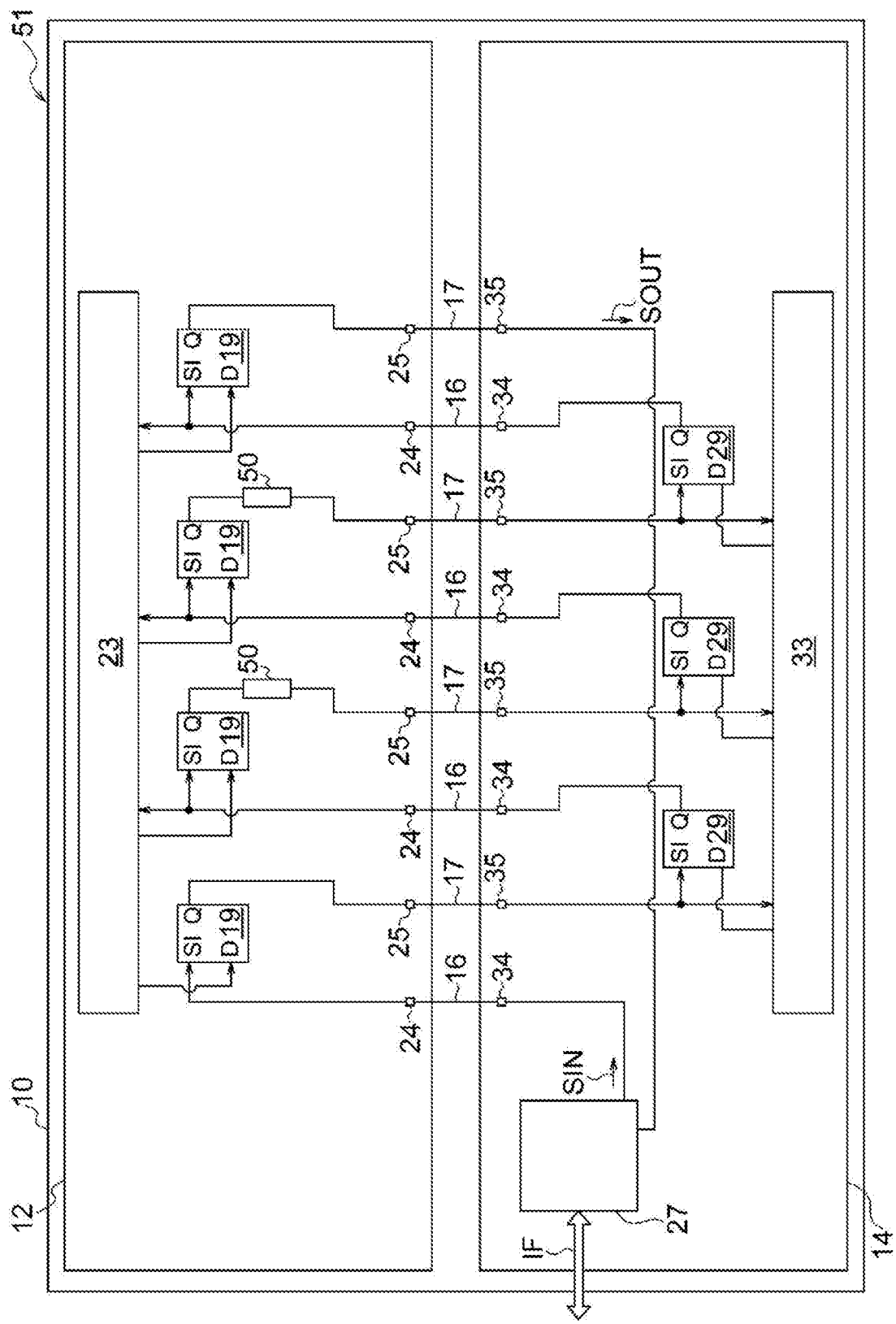
FIG. 5 is a diagram showing a semiconductor device not including a first selector.

FIG. 5 is a diagram showing a semiconductor device not provided with a plurality of first selectors. In the subsequent description, for ease of understanding, the reference numerals used in the semiconductor device 11 of FIG. 1 are used when it is possible to use the reference numerals. Referring to FIG. 5, a semiconductor device 51 is shown. The semiconductor device 51 includes a semiconductor chip 12 and a semiconductor chip 14 instead of the first semiconductor chip 13 and the second semiconductor chip 15. Each of the semiconductor chip 12 and the semiconductor chip 14 is not provided with the plurality of first selectors 21 of the semiconductor device 11. For example, the output (for example, the output Q) of the first flip-flop circuit 19 is directly connected to the first electrode 25. Further, the combinational logic circuit 50 is directly connected to the first electrode 25.

In the semiconductor device 51, the mismatch of the expected value related to the first connection conductor 17 is tested when the test pattern provided as the SIN signal from the test circuit 27 is returned to the test circuit 27 as the signal SOUT via the plurality of first flip-flop circuits (19, 29) in the test related to the scan chain. Hence, the test becomes clear after propagating through one or a plurality of flip-flop circuit or circuits located on the downstream side of the first connection conductor 17 that caused the mismatch of the expected values. Hence, the transfer time of the stage number of the downstream flip-flop circuit is required until the determination. Further, when there is the combinational logic circuit 50 between the flip-flop circuits (19, 29) on the propagation line of the test pattern, it cannot be determined which of the first connection conductor 17 and the combinational logic circuit 50 causes the mismatch of the expected value.

According to the semiconductor device 11 of FIG. 1, since the mismatch of the expected value related to the first connection conductor 17 is determined by inputting an expected value signal including an expected value to the selector circuit 21 in the test mode, it is possible to determine the mismatch of the expected value related to the first connection conductor 17 without delays related to the propagation of flip-flop circuits and regardless of the presence or absence of failures in the combinational logic circuit 50.

Figure 6:
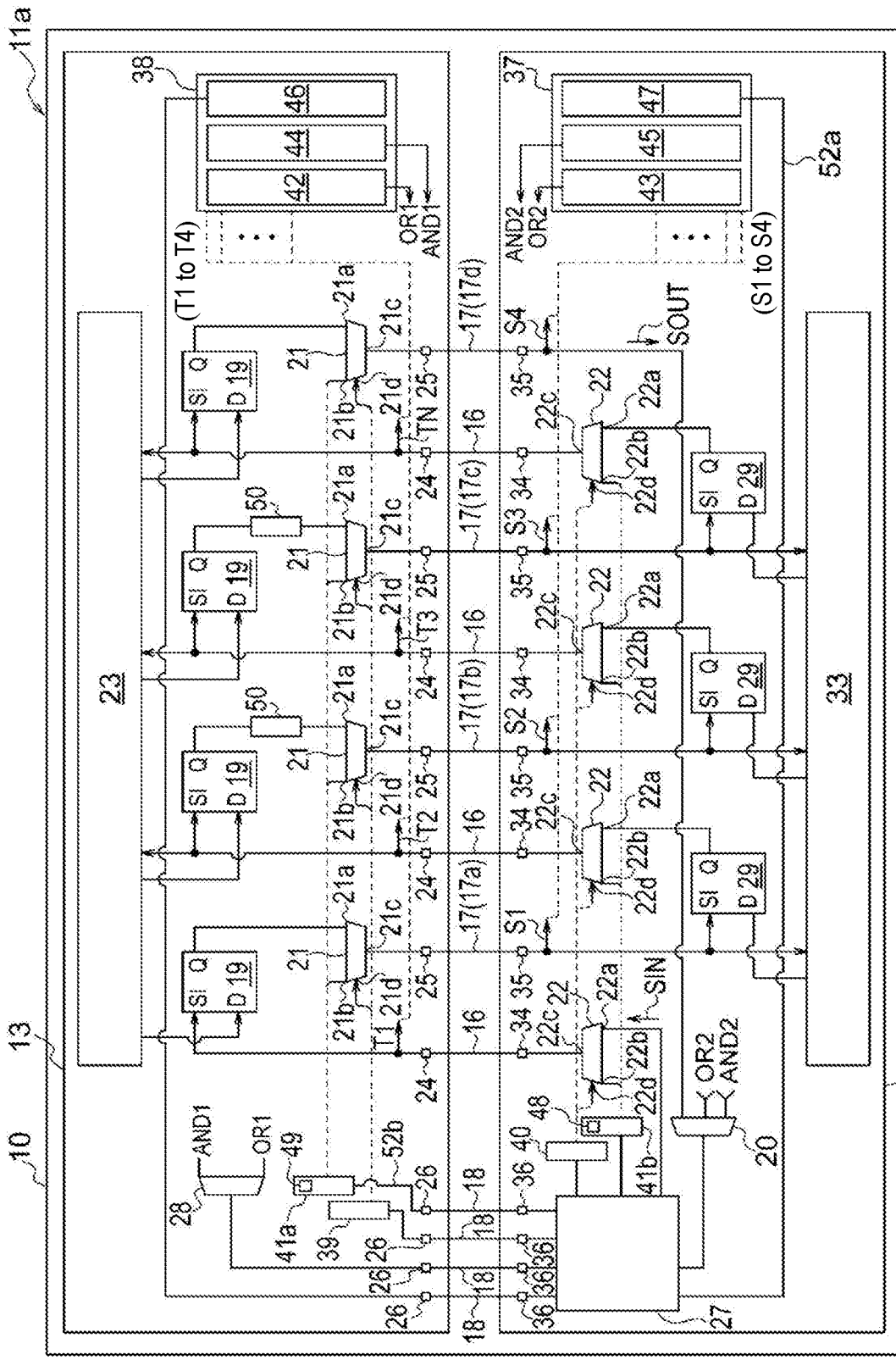
FIG. 6 is a diagram showing a semiconductor device according to another embodiment of the disclosure.

FIG. 6 is a diagram showing a semiconductor device according to another embodiment of the disclosure. In the semiconductor device 11 shown in FIG. 1, the plurality of first selectors 21 is arranged on the signal path for sending signals from the first semiconductor chip 13 to the second semiconductor chip 15. Referring to FIG. 6, in a semiconductor device 11a, a plurality of second selectors 22 is arranged on a signal path for sending signals from the second semiconductor chip 15 to the first semiconductor chip 13 in addition to the plurality of first selectors 21 of the semiconductor device 11 shown in FIG. 1. Hence, the plurality of second selectors 22 is provided in the second semiconductor chip 15.

The semiconductor device 11a can include a second detection circuit 38, a second selector control circuit 40, and a second expected value generation circuit 41b similarly to the semiconductor device 11. The second detection circuit 38, the second selector control circuit 40, and the second expected value generation circuit 41b are examples of the test circuit unit together with the test circuit 27, the first detection circuit 37, the first selector control circuit 39, and the first expected value generation circuit 41a.

In this embodiment, additional circuits for testing the expected values, for example, the second detection circuit 38, the second selector control circuit 40, and the second expected value generation circuit 41b are provided to the second semiconductor chip 15 while adding the plurality of second selectors 22. The second selector control circuit 40 controls the plurality of second selectors 22. The second expected value generation circuit 41b generates expected value signals of expected values [0] or [1] provided to the second selector 22.

Each of the plurality of second selectors 22 includes a second signal input 22a, a second expected value input 22b, a second selector output 22c, and a second selection input 22d. The second signal input 22a is connected to the output (for example, the output Q) of any one of the plurality of second flip-flop circuits 29 and receives a signal from the output. The second expected value input 22b receives an expected value signal of expected value [0] or [1] from the second expected value generation circuit 41b. The second selector output 22c is connected to the third electrode 34. The plurality of second selectors 22 connect the second expected value input 22b to the second selector output 22c in the test mode according to the embodiment that uses the test circuit 27. The plurality of second selectors 22 connect the second signal input 22a to the second selector output 22c in an operation mode different from the test mode.

Each of the plurality of third electrodes 34 receives a signal from the output of the second selector 22 and is connected to the fourth electrode 24 via the second connection conductor 16. The second detection circuit 38 receives each of the signals (T1 to T4) from the fourth electrodes 24 on the first semiconductor chip 13.

According to the semiconductor device 11a, the second selector control circuit 40 controls the plurality of second selectors 22 so that the plurality of second selectors 22 pass the expected value signal from the second expected value generation circuit 41b in the test mode. The expected value signal having passed through the second selector 22 is provided to the third electrode 34. The second detection circuit 38 receives each of the signals (T1 to T4) from the fourth electrode 24. When the expected value signal from the second expected value generation circuit 41b to the second expected value input 22b is given to the second detection circuit 38 via the plurality of third electrodes 34 of the second semiconductor chip 15 and the plurality of fourth electrodes 24 of the first semiconductor chip 13, it is possible to test whether or not the first semiconductor chip 13 and the second semiconductor chip 15 are properly connected via the second connection conductor 16.

In the semiconductor device 11a including the interconnection by four second connection conductors 16 between four third electrodes 34 and four fourth electrodes 24, the second detection circuit 38 receives four signals (T1 to T4) from four fourth electrodes 24. In the semiconductor device 11a, for example, when the fourth electrode 24 is configured to receive an expected value signal of an expected value [0] and [1] from the second selector 22 via the third electrode 34 and the second connection conductor 16, the second detection circuit 38 can detect the value of the signal input based on four signals (S1 to S4) from four fourth electrodes 24 and provide a value indicating the detection result.

The second detection circuit 38 can include, for example, at least one of the second OR circuit 42 and the second AND circuit 44. The second detection circuit 38 enables the same detection as the first detection circuit 37 for the plurality of second connection conductors 16. The second OR circuit 42 receives four signals (T1 to T4) from four fourth electrodes 24 and generates an OR result of four signals (T1 to T4) from four fourth electrodes 24. Further, the second AND circuit 44 receives four signals (T1 to T4) from four fourth electrodes 24 and generates an AND result of four signals (T1 to T4) from four fourth electrodes 24.

In this embodiment, the output value OR1 of the second OR circuit 42 and the output value AND1 of the second AND circuit 44 are connected to the test circuit 27 via the selector 28, the sixth electrode 26, the third connection conductor 18, and the fifth electrode 36. The selector 28 selects the signals from the second OR circuit 42 and the second AND circuit 44 and provides the signals to the test circuit 27.

According to such a connection, the test described with reference to FIG. 2A to FIG. 3B is enabled for the second connection conductor 16 using the second OR circuit 42 and the second AND circuit 44.

The second detection circuit 38 can include a second logic circuit 46 similarly to the semiconductor device 11. The second logic circuit 46 receives four signals (T1 to T4) from four fourth electrodes 24 and generates a set of values based on four signals (T1 to T4) from four fourth electrodes 24. The second logic circuit 46 can have the same configuration as the first logic circuit 47. In this embodiment, the second expected value generation circuit 41b is configured to generate a combination of sets of expected values in a manner similar to the second expected value generation circuit 41a. The second selector control circuit 40 is configured to control the plurality of second selectors 22 in a manner similar to the first selector control circuit 39.

According to such a configuration, the test described with reference to FIG. 4A and FIG. 4B is enabled for the second connection conductor 16 using the second logic circuit 46.

A second encoder circuit 48 that generates a signal value corresponding to the number of the second selectors 22 connected to the third electrode 34 related to all interconnections to be inspected may be provided to the second expected value generation circuit 41b in order to generate such a combination of expected values. Further, a decoder circuit that generates a value based on the signals from the plurality of fourth electrodes by receiving the signals from the fourth electrodes 24 related to all interconnections to be inspected may be provided to the second logic circuit 46 in order to analyze the mismatch of the expected values to be generated. In this embodiment, the signal from this decoder circuit is provided to the test circuit 27 via the sixth electrode 26, the third connection conductor 18, and the fifth electrode 36 in order to test the value of the signal from the fourth electrode 24.

If necessary, the combinational logic circuit 50 may be connected on the path that connects the second signal input 22a of the second selector 22 and the output (for example, the output Q) of the second flip-flop 29.

According to the semiconductor device 11a of FIG. 6, since the mismatch of the expected values related to the first connection conductors 17 and 16 is determined by inputting an expected value signal including an expected value to the selector circuits 21 and 22 in the test mode similarly to the semiconductor device 11 of FIG. 1, it is possible to determine the mismatch of the expected values related to the first connection conductors 17 and 16 without delays related to the propagation of flip-flop circuits and regardless of the presence or absence of failures in combinational logic circuits.

As described above, according to this embodiment, there is provided the semiconductor device capable of shortening the time for testing whether the connection between the semiconductor chips is good or bad.

In FIGS. 1 and 6, the first detection circuit 37, the first selector control circuit 39, the first expected value generation circuit 41a, the second detection circuit 38, the second selector control circuit 40, and the second expected value generation circuit 41b are drawn outside the test circuit 27, but the test circuit 27 can include the first detection circuit 37, the first selector control circuit 39, the first expected value generation circuit 41a, the second detection circuit 38, the second selector control circuit 40, and the second expected value generation circuit 41b. In this case, the test circuit 27 can be provided in at least one of the first semiconductor chip 13 and the second semiconductor chip 15.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device comprising:
a first semiconductor chip which includes a first internal circuit, a plurality of first flip-flop circuits connected to the first internal circuit, a plurality of first selectors, and a plurality of first electrodes connected to respective outputs of the plurality of first selectors;
a plurality of first connection conductors; and
a second semiconductor chip which includes a plurality of second electrodes respectively connected to the plurality of first electrodes via the plurality of first connection conductors and a second internal circuit connected to at least one of the plurality of second electrodes,
wherein at least one of the first semiconductor chip and the second semiconductor chip includes a part of a test circuit unit,
wherein the test circuit unit includes a first detection circuit which receives a signal from each of the plurality of second electrodes, a first selector control circuit which controls the plurality of first selectors, a first expected value generation circuit which generates a first expected value signal including a first expected value, and a test circuit which receives an output of the first detection circuit, and
wherein each of the plurality of first selectors includes a first signal input which receives a signal from any one of the plurality of first flip-flop circuits and a first expected value input which receives the first expected value signal from the first expected value generation circuit.

2. The semiconductor device according to claim 1, wherein each of the plurality of first selectors outputs the first expected value signal input to the first expected value input in a test mode and outputs a signal which is from any one of the plurality of first flip-flop circuits and input to the first signal input in an operation mode different from the test mode.

3. The semiconductor device according to claim 1, wherein the first detection circuit includes a first OR circuit which receives the signal from each of the plurality of second electrodes and generates an OR result of the signals from the plurality of second electrodes.

4. The semiconductor device according to claim 1, wherein the first detection circuit includes a first AND circuit which receives the signal from each of the plurality of second electrodes and generates an AND result of the signals from the plurality of second electrodes.

5. The semiconductor device according to claim 1,
wherein the first expected value generation circuit includes a first encoder circuit which generates a signal value corresponding to the number of the plurality of first selectors, and
wherein the first detection circuit includes a first decoder circuit which receives the signals from the plurality of second electrodes and generates a value based on the signals from the plurality of second electrodes.

6. The semiconductor device according to claim 1,
wherein the first semiconductor chip further includes at least one combinational logic circuit, and
wherein in at least one first selector of the plurality of first selectors, a signal from at least one first flip-flop circuit of the plurality of first flip-flop circuits is input via the combinational logic circuit of the first semiconductor chip.

7. A semiconductor device comprising:
a first semiconductor chip which includes a first internal circuit, a plurality of first flip-flop circuits connected to the first internal circuit, a plurality of first selectors, and a plurality of first electrodes connected to respective outputs of the plurality of first selectors;
a plurality of first connection conductors;
a plurality of second connection conductors; and
a second semiconductor chip which includes a second internal circuit, a plurality of second flip-flop circuits connected to the second internal circuit, a plurality of second selectors, a plurality of second electrodes respectively connected to the plurality of first electrodes via the plurality of first connection conductors, and a plurality of third electrodes connected to respective outputs of the plurality of second selectors,
wherein the first semiconductor chip further includes a plurality of fourth electrodes which are respectively connected to the plurality of third electrodes via the plurality of second connection conductors,
wherein at least one of the first semiconductor chip and the second semiconductor chip includes a part of a test circuit unit,
wherein the test circuit unit includes a first detection circuit which receives a signal from each of the plurality of second electrodes, a first selector control circuit which controls the plurality of first selectors, a first expected value generation circuit which generates a first expected value signal including a first expected value, a second detection circuit which receives a signal from each of the plurality of fourth electrodes, a second selector control circuit which controls the plurality of second selectors, a second expected value generation circuit which generates a second expected value signal including a second expected value, and a test circuit which receives outputs of the first detection circuit and the second detection circuit,
wherein each of the plurality of first selectors includes a first signal input which receives a signal from any one of the plurality of first flip-flop circuits and a first expected value input which receives the first expected value signal from the first expected value generation circuit, and
wherein each of the plurality of second selectors includes a second signal input which receives a signal from any one of the plurality of second flip-flop circuits and a second expected value input which receives the second expected value signal from the second expected value generation circuit.

8. The semiconductor device according to claim 7,
wherein each of the plurality of second selectors outputs the second expected value signal input to the second expected value input in a test mode and outputs a signal that is from any one of the plurality of second flip-flop circuits and input to the second signal input in an operation mode different from the test mode.

9. The semiconductor device according to claim 7,
wherein the second detection circuit includes a second OR circuit which receives a signal from each of the plurality of fourth electrodes and generates an OR result of the signals from the plurality of fourth electrodes.

10. The semiconductor device according to claim 7,
wherein the second detection circuit includes a second AND circuit which receives a signal from each of the plurality of fourth electrodes and generates an AND result of the signals from the plurality of fourth electrodes.

11. The semiconductor device according to claim 7,
wherein the second expected value generation circuit includes a second encoder circuit which generates a signal value corresponding to the number of the plurality of second selectors, and
wherein the second detection circuit includes a second decoder circuit which receives signals from the plurality of fourth electrode and generates a value based on the signals from the plurality of fourth electrodes.

12. The semiconductor device according to claim 7,
wherein the second semiconductor chip further includes at least one combinational logic circuit, and
wherein in at least one second selector of the plurality of second selectors, a signal from at least one second flip-flop circuit of the plurality of second flip-flop circuits is input via the combinational logic circuit of the second semiconductor chip.

13. A semiconductor device testing method for a semiconductor device including: a first semiconductor chip which includes a first internal circuit, a plurality of first flip-flop circuits connected to the first internal circuit, a plurality of first selectors, and a plurality of first electrodes connected to respective outputs of the plurality of first selectors; a plurality of first connection conductors; and a second semiconductor chip which includes a plurality of second electrodes respectively connected to the plurality of first electrodes via the plurality of first connection conductors and a second internal circuit connected to at least one of the plurality of second electrodes,
wherein at least one of the first semiconductor chip and the second semiconductor chip includes a part of a test circuit unit,
wherein the test circuit unit includes a first detection circuit which receives a signal from each of the plurality of second electrodes, a first selector control circuit which controls the plurality of first selectors, a first expected value generation circuit which generates a first expected value signal including a first expected value, and a test circuit which receives an output of the first detection circuit, and
wherein the first expected value generation circuit generates and supplies the first expected value signal of the same first expected value to all of the plurality of first selectors, the first selector control circuit controls the plurality of first selectors to output the first expected value signal input to a first expected value input of each of the plurality of first selectors, the first detection circuit generates a value indicating a first detection result based on a signal input from each of the plurality of second electrodes, and the test circuit tests whether or not the first expected value matches a value indicating the first detection result.

14. The semiconductor device testing method according to claim 13, wherein the first expected value generation circuit generates and supplies the first expected value signal of the first expected value to the plurality of first selectors such that a first value of the first expected value of the first expected value signal is supplied to one of the plurality of first selectors and a second value of the first expected value of the first expected value signal different from the first value is supplied to other first selectors of the plurality of first sectors, the first selector control circuit controls the plurality of first selectors to output the first expected value signal input to the first expected value input of each of the plurality of first selectors, the first detection circuit generates a value indicating a first detection result based on signals input from the plurality of second electrodes, and the test circuit tests whether or not a set of the first expected values match a set of values indicating the first detection result.

* * * * *